(12) United States Patent
Nagata et al.

(10) Patent No.: US 9,909,196 B2
(45) Date of Patent: Mar. 6, 2018

(54) HIGH-PURITY COPPER-COBALT ALLOY SPUTTERING TARGET

(71) Applicant: JX Nippon Mining & Metals Corporation, Tokyo (JP)

(72) Inventors: Kenichi Nagata, Ibaraki (JP); Tomio Otsuki, Ibaraki (JP)

(73) Assignee: JX Nippon Mining & Metals Corporation, Tokyo (JP)

(*) Notice: Subject to any disclaimer, the term of this patent is extended or adjusted under 35 U.S.C. 154(b) by 0 days.

(21) Appl. No.: 14/759,424

(22) PCT Filed: Feb. 19, 2014

(86) PCT No.: PCT/JP2014/053892
§ 371 (c)(1),
(2) Date: Jul. 7, 2015

(87) PCT Pub. No.: WO2014/132857
PCT Pub. Date: Sep. 4, 2014

(65) Prior Publication Data
US 2015/0354047 A1  Dec. 10, 2015

(30) Foreign Application Priority Data
Mar. 1, 2013  (JP) .................................. 2013-040697

(51) Int. Cl.
*C22C 9/06* (2006.01)
*H01J 37/34* (2006.01)
(Continued)

(52) U.S. Cl.
CPC .................. *C22C 9/06* (2013.01); *C22F 1/08* (2013.01); *C23C 14/165* (2013.01); *C23C 14/3414* (2013.01); *H01J 37/3429* (2013.01)

(58) Field of Classification Search
CPC . C22C 9/06; C22F 1/08; C23C 14/165; C23C 14/3414; H01J 37/3429
(Continued)

(56) References Cited

U.S. PATENT DOCUMENTS 8,425,736 B2    4/2013  Chang et al.
2001/0035237 A1* 11/2001  Nagano .................... C22C 5/08
                                                                148/430

(Continued)

FOREIGN PATENT DOCUMENTS

JP    H11-050242 A    2/1999
JP    2003-342653 A   12/2003
(Continued)

*Primary Examiner* — Rodney G McDonald
(74) *Attorney, Agent, or Firm* — Howson & Howson LLP

(57) ABSTRACT

A high purity copper-cobalt alloy sputtering target containing 0.1 to 20 at % of Co, and remainder being Cu and unavoidable impurities, wherein a size (dimension) of precipitates in the target structure is 10 μm or less, and a number of precipitates is 500 precipitates/mm² or less. It is thereby possible to provide a high purity copper-cobalt alloy sputtering target capable of inhibiting the generation of particles during sputtering, and in particular improving the yield and reliability of semiconductor products that are being subject to further miniaturization and higher integration.

12 Claims, 1 Drawing Sheet

(51) Int. Cl.
*C22F 1/08* (2006.01)
*C23C 14/16* (2006.01)
*C23C 14/34* (2006.01)

(58) Field of Classification Search
USPC ....... 204/298.12, 298.13; 148/538, 553, 554, 148/557, 432
See application file for complete search history.

(56) References Cited

U.S. PATENT DOCUMENTS

| | | |
|---|---|---|
| 2005/0127364 A1 | 6/2005 | Inoue |
| 2006/0091792 A1 | 5/2006 | Kugimiya et al. |
| 2009/0020192 A1* | 1/2009 | Segal .................. C23C 14/3414 148/536 |

FOREIGN PATENT DOCUMENTS

| | | |
|---|---|---|
| JP | 2005-220384 A | 8/2005 |
| JP | 2010-065252 A | 3/2010 |

\* cited by examiner

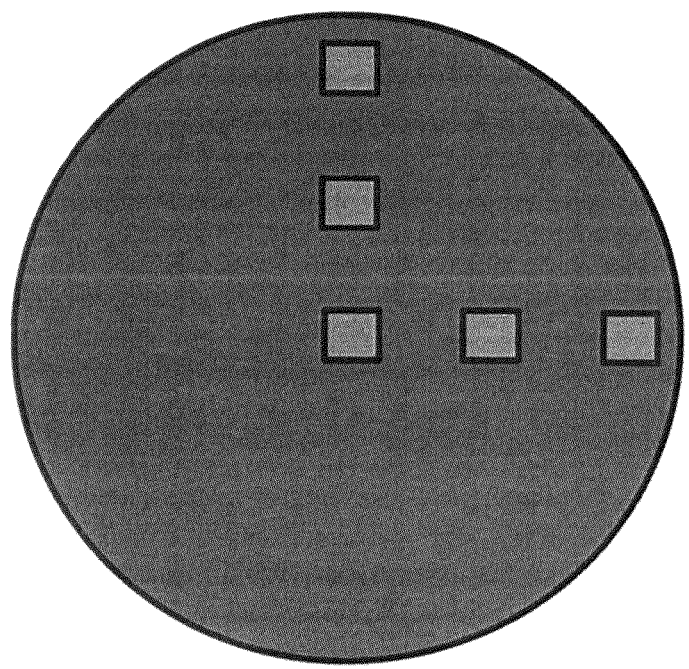

HIGH-PURITY COPPER-COBALT ALLOY SPUTTERING TARGET

BACKGROUND

The present invention relates to a high purity copper-cobalt alloy sputtering target capable of inhibiting the generation of particles. When the component composition is indicated as "%" in the present specification, all such component compositions shall mean "at %" even when there is no particular indication.

Conventionally, while an Al alloy (specific resistance of roughly 3.0 µΩ·cm) has been used as the wiring material of semiconductor devices, pursuant to the miniaturization of wirings, a copper wiring with lower resistance (specific resistance of roughly 2.0 µΩ·cm) has been put into practical application. As the process for forming a copper wiring, generally adopted is the method of forming a diffusion barrier layer made from Ta or TaN on a wiring or a wiring groove, and thereafter subjecting copper to sputter deposition. High purity copper of 5N to 6N is normally produced by performing wet or dry purification to electrolytic copper having a purity level of 4N (excluding gas components) as the crude metal, and this has been used as a sputtering target.

As described above, while copper is extremely effective as a wiring for semiconductors, the reliability of copper wirings is deteriorating due to electromigration and formation of stress-induced voids associated with the miniaturization of wirings, and improvement in the copper wiring material itself is now being demanded. A copper-cobalt alloy can be suggested as this kind of material.

When forming a thin film layer by the sputtering method, a copper-cobalt alloy target is required. The production of this target can be generally classified into the following two types of production methods; namely, the sintering method and the melting/casting method. It can be said that this target is preferably produced by the melting/casting method from the perspective of strength, density and production efficiency of the target.

Nevertheless, a copper-cobalt alloy target has an inherent problem; specifically, a problem in that numerous particles are generated during sputtering.

Thus, upon reviewing the conventional technologies, several kinds of copper-cobalt alloy sputtering targets, in which cobalt (Co) is added to copper (Cu), have been proposed.

For example, Patent Document 1 below describes a Cu-based sputtering target for use in forming an electrode film, wherein 2 to 20 at % of one or more types of transition metal elements selected from (Cr, Co, Mo, W, Fe, Nb, V) are contained, and, in a Cu-based matrix, dispersed is a simple substance of each transition metal element that is insoluble in the matrix, or a transition metal element phase as an alloy phase. Nevertheless, since this technology produces the target by powder metallurgy, it is not advisable from the perspective of strength, density and production efficiency of the target.

Moreover, Patent Document 2 below describes a production method of a fine crystal grain copper material for producing a copper material with fine crystal grains by multi-axis forging treatment where a copper material made from high purity copper or low concentration copper alloy is subject to compression forming from different directions, wherein the initial treatment temperature T1 of performing the first pass of compression forming in the multi-axis forging treatment is a temperature in which dynamic recrystallization occurs at least partially in the copper material.

Patent Document 2 further describes providing a fine crystal grain copper material that is produced based on the foregoing production method, and a sputtering target made from such fine crystal grain copper material. While Co is listed as an additive element of the copper material of Patent Document 2, no specific examples are given, and Patent Document 2 fails to provide any description indicating the generation status of particles after the target is processed.

Moreover, Patent Document 3 below describes a Cu-based sputtering target material capable of producing a thin film having low specific resistance, high corrosion resistance, and small non-uniformity of components, wherein the sputtering target material: has a Cu-based matrix as the main phase; contains an element that is insoluble with Cu and indicates a monotectic system or peritectic system phase diagram; and has a second phase, which is primarily made from the foregoing element, that is precipitated in the Cu matrix at an average area ratio of 5% or less. In this sputtering target material, the average diameter of the second phase is 50 µm or less.

While Co is added to this material, since the raw material is powder and the target is not produced by performing HIP treatment to the raw material powder, this technology is not advisable from the perspective of strength, density and production efficiency of the target.

Moreover, Patent Document 4 below describes realizing an alloy (Cu alloy), which has Cu as its main component and of which adhesion with a glass substrate or a silicon film is improved, and providing a wiring material using this Cu alloy. In order to realize the above, Patent Document 4 proposes using, as the wiring material, a Cu alloy made from Cu, and Au and/or Co, wherein the composition ratio of Cu is 80 to 99.5 wt %, and the sum of the composition ratio of Au and the composition ratio of Cu is 0.5 to 20 wt %. Patent Document 4 further describes that, as a result of depositing the foregoing wiring material on a glass substrate or a silicon wafer based on the sputtering method, sufficiently low electrical resistance and strong adhesive strength with the substrate were observed.

Nevertheless, paragraph 0053 of Patent Document 4 only briefly describes the process of producing a sputtering target, and it appears that Patent Document 4 has no interest whatsoever regarding the problem of the generation of particles when the target is processed.

Generally speaking, upon producing a target, a melted and cast copper-cobalt alloy ingot is processed into a target shape of a predetermined dimension, and the surface thereof is machined to produce the sputtering target.

When the smoothness of the target surface is improved, it is possible to suppress the generation of particles during sputtering, and form a thin film with superior evenness (uniformity).

Nevertheless, with a copper-cobalt alloy, there are problems that cannot be resolved only by causing the surface to be smooth, and there is no conventional technology that has developed a target material based on the foregoing perspective.

Patent Document 1: Japanese Patent No. 3710022
Patent Document 2: JP 2010-65252 A
Patent Document 3: JP 2005-220384 A
Patent Document 4: JP 2003-342653 A

SUMMARY

Generally speaking, a CuCo alloy is subject to age-hardening (precipitation hardening) treatment (for instance, heat treatment in the atmosphere at 1000° C.×1 hr, and subsequent water cooling), and thereafter subject to age-hardening treatment at a temperature of 700° C. or less in order to increase the strength. As a result of sputtering the target produced with this kind of conventional method, there was a problem in that numerous particles were generated.

Through investigation of this cause, it was discovered that numerous spherical Cu—Co precipitates existed within the structure, and such spherical Cu—Co precipitates caused the particle generation. It was further discovered that the generation of these precipitates depends on the purity, oxygen concentration, and carbon concentration of the CuCo alloy. Accordingly, further investigation of the cause and detailed measures were necessary.

The pressing issue is to resolve the generation of particles during sputtering, and if this problem can be resolved, it is possible to improve the yield and reliability of semiconductor products that are being subject to further miniaturization and higher integration, and provide a high purity copper-cobalt alloy sputtering target that is effective in forming a copper alloy wiring for semiconductors. The present invention aims to resolve the foregoing problems.

In order to resolve the foregoing problems, the present invention provides the following invention.

1) A high purity copper-cobalt alloy sputtering target containing 0.1 to 20 at % of Co, and remainder being Cu and unavoidable impurities, wherein a size (dimension) of precipitates in the target structure is 10 μm or less, and a number of precipitates is 500 precipitates/mm² or less.

2) The high purity copper-cobalt alloy sputtering target according to 1) above containing 0.1 to 20 at % of Co, and remainder being Cu and unavoidable impurities, wherein carbon (C) and oxygen (O) as impurities contained in the target are each 10 ppm or less, and purity is 99.99% (4N) or higher.

3) The high purity copper-cobalt alloy sputtering target according to 1) or 2) above, wherein the target is produced by subjecting a target raw material to melting, casting, forging, heat treatment, and machining.

4) A method of producing the high purity copper-cobalt alloy sputtering target of 1) or 2) above containing 0.1 to 20 at % of Co, and remainder being Cu and unavoidable impurities, wherein raw materials of cobalt and copper are subject to melting and casting to prepare an ingot, and the ingot is subject to hot forging, cold rolling and heat treatment, without going through age-hardening treatment, and processed into a target.

5) The method of producing a high purity copper-cobalt alloy sputtering target according to 4) above, wherein purity of the raw material is 99.99% (4N) or higher, and carbon (C) and oxygen (O) as impurities contained in the raw material are each 10 ppm or less.

The high purity copper-cobalt alloy sputtering target of the present invention is a high purity copper-cobalt alloy sputtering target containing 0.1 to 20 at % of Co, and remainder being Cu and unavoidable impurities, wherein carbon (C) and oxygen (O) as impurities contained in the target are each 10 ppm or less, and purity is 99.99% (4N) or higher. It is thereby possible to inhibit the generation of particles during sputtering.

Consequently, the present invention yields an effect of being able to provide a sputtering target capable of improving the yield and reliability of semiconductor products that are being subject to further miniaturization and higher integration.

BRIEF DESCRIPTION OF DRAWINGS

FIG. 1 This is a diagram showing the measurement locations for evaluating the precipitates of the target, and also an explanatory diagram showing the five locations that were subject to measurement (center part, R/2 part×2 locations, outer peripheral part×2 locations).

DETAILED DESCRIPTION

The high purity copper-cobalt alloy sputtering target of the present invention is a high purity copper-cobalt alloy sputtering target containing 0.1 to 20 at % of Co, and remainder being Cu and unavoidable impurities, and having a purity of 99.99% (4N) or higher. In addition, carbon (C) and oxygen (O) as impurities contained in the target are each 10 ppm or less.

It is thereby possible to considerably reduce the Cu—Co precipitates in the target structure. Note that the matrix of the target structure is in a state of Co existing as a solid solution in Cu.

As described above, the Cu—Co precipitates in the target structure become the direct cause of the generation of particles during sputtering and the deterioration in the deposition quality. Thus, it could be said that the inhibition (reduction) of precipitates is a considerable effect yielded by the high purity copper-cobalt alloy sputtering target of the present invention.

Note that the composition range of the copper-cobalt alloy needs to be within the foregoing range because the electromigration resistance performance and the stress-induced void resistance performance will deteriorate if Co is less than 0.1 at %, and the resistance will increase and the function as a copper alloy wiring for semiconductors will deteriorate if Co exceeds 20 at %, and both of these cases are undesirable.

Moreover, since the effect of being able to improve the machinability and workability is also yielded when Co is added within the foregoing range, an additional effect is yielded in that the production of the target is facilitated and the productivity can be improved.

Moreover, improvement in the machinability yields the effects of being able to improve the smoothness of the target surface and further inhibit the generation of particles during sputtering.

Moreover, with the high purity copper-cobalt alloy sputtering target of the present invention, the size (dimension) of precipitates in the target structure is 10 μm or less, and the number of precipitates is 500 precipitates/mm² or less. This is also an important feature of the present invention. To reduce the size (dimension) of precipitates and to reduce the number of precipitates are important indexes for obtaining a favorable target.

In addition, the high purity copper-cobalt alloy sputtering target of the present invention can be produced by subjecting a target raw material to melting, casting, forging, heat treatment, and machining. This production method enables the improvement in density and strength in comparison with conventional sintered compact targets.

The method of producing the high purity copper-cobalt alloy sputtering target of the present invention includes the following steps; namely, raw materials of cobalt and copper are subject to melting/casting to prepare an ingot, and the ingot is subject to hot forging, cold rolling and heat treatment, without going through age-hardening treatment, and processed into a target.

What is important here is that age-hardening treatment was conventionally considered a normal technical means for improving the strength upon producing a copper-cobalt alloy. Nevertheless, such age-hardening treatment must not be performed in the production of the sputtering target of the present invention.

In other words, if age-hardening treatment is performed, it becomes difficult to inhibit the generation of Cu—Co precipitates in the target structure even within the component range described above.

Upon producing the high purity copper-cobalt alloy sputtering target of the present invention, purity of the raw material is 99.99% (4N) or higher, and carbon (C) and oxygen (O) as impurities contained in the raw material are each 10 ppm or less. It is necessary to limit, as much as possible, the increase of these impurities during the production of the target. Carbon (C) and oxygen (O) cause the formation of carbides and oxides.

The foregoing processes enable the size (dimension) of precipitates in the target structure to be 10 μm or less, and the number of precipitates to be 500 precipitates/mm² or less, and the generation of particles can be considerably reduced by sputtering the obtained high purity copper-cobalt alloy sputtering target.

Upon producing the high purity copper-cobalt alloy sputtering target of the present invention, high purity copper having a purity of 4N or higher and cobalt as an additive element having a purity of 4N or higher are placed in a carbon crucible to perform melting. Otherwise, high purity copper having a purity of 4N or higher is melted in advance in a carbon crucible, and cobalt having a purity of 4N or higher is added thereto in order to obtain the intended component composition.

By casting thus obtained alloy, it is possible to obtain the high purity copper-cobalt alloy ingot of the present invention containing 0.1 to 20 at % of Co and an additive element.

Moreover, one or more elements selected from Sb, Zr, Ti, Cr, Ag, Au, Cd, In, As, Be, B, Mg, Mn, Al, Si, Ca, Ba, La, and Ce can be added, as needed, to this copper-cobalt alloy in a total amount of 500 ppm or less. Since these additive elements yield an effect of refining the grain size, these additive elements may be suitably added when it is necessary to control the crystal grain size.

Subsequently, the copper-cobalt alloy ingot is subject to hot forging at a predetermined forging ratio, and thereafter subject to rolling at a predetermined rolling reduction in order to obtain a rolled plate. The obtained rolled plate is additionally subject to heat treatment at a predetermined temperature and time.

The target is thereafter subject to surface treatment such as grinding and polishing, bonded to a backing plate, and subject to additional finishing in order to produce a sputtering target assembly produced from the high purity copper-cobalt alloy of the present invention.

EXAMPLES

The present invention is now explained based on the Examples. The Examples indicated below are provided for facilitating the understanding of the present invention, and the present invention is not limited by these Examples. In other words, modifications and other embodiments based on the technical concept of the present invention are also covered by the present invention as a matter of course.

Example 1

In Example 1, high purity copper (Cu) having a purity of 4N was melted in a high vacuum atmosphere using a carbon crucible. Moreover, high purity cobalt (Co) having a purity of 4N was adjusted, and placed in a molten metal of copper. The molten metal of the copper-cobalt alloy was poured in a water-cooled copper mold in a high vacuum atmosphere to obtain an ingot. The size of the ingot was φ160 mm×300 mmL. The foregoing procedures were performed in all of the following Examples (excluding the purity).

The structure of the obtained Cu-0.1 at % Co ingot having a purity of 4N, C: 4 ppm, and O: 5 ppm was adjusted by forging at a temperature of 900° C., cold rolling (rolling reduction of 70%), and heat treatment (500° C.) to prepare a target. The size of the target was φ430 mm×7 mmt. Since the dimension of the target is the same in the following Examples and Comparative Examples, the description thereof is hereinafter omitted.

The number of precipitates of 10 μm or less in the prepared target was 130 precipitates/mm².

Subsequently, in order to evaluate the film quality of the thin film formed by sputtering the obtained target, the target of Example 1 was sputtered to deposit a film, and the generation of particles was evaluated. The results are shown in Table 1.

The sputtering conditions were as follows.
Applied power: 38 [kW]
Deposition time: 6.5 [sec]
Ar flow rate: 4 [sccm]

The precipitates were evaluated as follows.

An area of 1 mm×1 mm was observed at five locations on the target as shown in FIG. 1, and for each area the number of precipitates having a size (dimension) of 10 μm or less was counted, and the average thereof was divided by an area of 1 mm×1 mm. Note that the average of the long diameter and the short diameter was used as the size (dimension) of the precipitates.

The particles were evaluated by measuring the number of particles on the deposition surface by using Surfscan manufactured by KLA-Tencor, and the number of particles of 0.08 μm or more (particles/wafer) and the number of particles of 0.2 μm or more (particles/wafer) were counted.

The numbers of particles (average value) on the wafer were 5.2 particles/wafer with respect to particles of 0.2 μm or more, and 9.8 particles/wafer with respect to particles of 0.08 μm or more, and that resulted in extremely small numbers of particles. Note that the expression "number of particles (average value)" refers to the "average value" of three wafers of 300 mmφ, and the same applies hereinafter.

Table 1 shows the Co content of the target, whether age-hardening treatment was performed, purity (%), C concentration (ppm), O concentration (ppm), number of precipitates (10 μm or less), and the result and evaluation of measuring the number of particles (average value).

TABLE 1

| | Co concentration (at %) | Age-hardening treatment | Purity (%) | C concentration (wtppm) | O concentration (wtppm) | Number of precipitates (10 μm or less) | Number of particles on wafer (average) | |
|---|---|---|---|---|---|---|---|---|
| | | | | | | | 0.2 μm or more (particles/wafer) | 0.08 μm or more (particles/wafer) |
| Example 1 | 0.1 | No | 99.99 | 4 | 5 | 130 | 5.2 | 9.8 |
| Example 2 | 1.0 | No | 99.995 | 5 | 9 | 300 | 6.1 | 11.3 |
| Example 3 | 5.0 | No | 99.995 | 2 | 8 | 290 | 6.0 | 10.8 |
| Example 4 | 10.0 | No | 99.995 | 7 | 5 | 360 | 6.3 | 12.1 |

TABLE 1-continued

|  | Co concentration (at %) | Age-hardening treatment | Purity (%) | C concentration (wtppm) | O concentration (wtppm) | Number of precipitates (10 μm or less) | Number of particles on wafer (average) | |
|---|---|---|---|---|---|---|---|---|
|  |  |  |  |  |  |  | 0.2 μm or more (particles/wafer) | 0.08 μm or more (particles/wafer) |
| Example 5 | 20 | No | 99.999 | 9 | 9 | 450 | 6.7 | 12.5 |
| Comparative Example 1 | 0.1 | Yes | 99.99 | 4 | 6 | 800 | 38.3 | 102.8 |
| Comparative Example 2 | 1.0 | Yes | 99.995 | 3 | 8 | 750 | 49.1 | 111.5 |
| Comparative Example 3 | 5.0 | Yes | 99.995 | 2 | 7 | 680 | 42.1 | 98.3 |
| Comparative Example 4 | 10.0 | Yes | 99.995 | 6 | 9 | 560 | 33.1 | 65.2 |
| Comparative Example 5 | 20 | Yes | 99.999 | 5 | 8 | 900 | 56.3 | 123.2 |
| Comparative Example 6 | 0.1 | No | 99.95 | 2 | 7 | 890 | 32.1 | 121.1 |
| Comparative Example 7 | 1 | No | 99.95 | 6 | 3 | 850 | 31.9 | 111.9 |
| Comparative Example 8 | 5 | No | 99.95 | 3 | 4 | 820 | 34.8 | 100.2 |
| Comparative Example 9 | 10 | No | 99.95 | 8 | 5 | 860 | 35.2 | 140.2 |
| Comparative Example 10 | 20 | No | 99.95 | 4 | 5 | 760 | 43.7 | 79.2 |
| Comparative Example 11 | 0.1 | No | 99.99 | 12 | 4 | 800 | 39.2 | 78.9 |
| Comparative Example 12 | 0.1 | No | 99.99 | 6 | 13 | 830 | 33.8 | 65.3 |
| Comparative Example 13 | 1.0 | No | 99.99 | 20 | 5 | 680 | 28.9 | 49.7 |
| Comparative Example 14 | 1.0 | No | 99.99 | 7 | 30 | 800 | 31.1 | 57.7 |
| Comparative Example 15 | 5.0 | No | 99.99 | 15 | 5 | 560 | 35.2 | 78.9 |
| Comparative Example 16 | 5.0 | No | 99.99 | 5 | 14 | 620 | 44.2 | 77.9 |
| Comparative Example 17 | 10.0 | No | 99.99 | 11 | 6 | 590 | 32.5 | 69.2 |
| Comparative Example 18 | 10.0 | No | 99.99 | 9 | 19 | 540 | 29.7 | 56.6 |
| Comparative Example 19 | 20.0 | No | 99.99 | 14 | 9 | 630 | 23.4 | 59.8 |
| Comparative Example 20 | 20.0 | No | 99.99 | 5 | 20 | 810 | 26.7 | 69.4 |

1 wafer = 300 mmϕ

Example 2

Since the same processes as Example 1 (excluding the purity) were performed up to obtaining the ingot, the description thereof is omitted. The structure of the obtained Cu-1 at % Co ingot having a purity of 4N5, C: 5 ppm, and O: 9 ppm was adjusted by forging at a temperature of 900° C., cold rolling (rolling reduction of 70%), and heat treatment (500° C.) to prepare a target.

The number of precipitates of 10 μm or less in the prepared target was 300 precipitates/mm$^2$. The prepared target was sputtered to deposit a film using a sputtering equipment, and the number of particles on the wafer was measured.

The number of particles was measured in the same manner as Example 1. The numbers of particles (average value) on the wafer were 6.1 particles/wafer with respect to particles of 0.2 μm or more, and 11.3 particles/wafer with respect to particles of 0.08 μm or more, and that resulted in extremely small numbers of particles.

Table 1 shows the Co content of the target, whether age-hardening treatment was performed, purity (%), C concentration (ppm), O concentration (ppm), number of precipitates (10 μm or less), and the result and evaluation of measuring the number of particles (average value).

Example 3

Since the same processes as Example 1 (excluding the purity) were performed up to obtaining the ingot, the description thereof is omitted. The structure of the obtained Cu-5 at % Co ingot having a purity of 4N5, C: 2 ppm, and O: 8 ppm was adjusted by forging at a temperature of 900° C., cold rolling (rolling reduction of 70%), and heat treatment (500° C.) to prepare a target. The number of precipitates of 10 μm or less in the prepared target was 290 precipitates/mm$^2$. The prepared target was sputtered to deposit a film using a sputtering equipment, and the number of particles on the wafer was measured.

The number of particles was measured in the same manner as Example 1. The numbers of particles (average value) on the wafer were 6.0 particles/wafer with respect to particles of 0.2 μm or more, and 10.8 particles/wafer with respect to particles of 0.08 μm or more, and that resulted in extremely small numbers of particles.

Table 1 shows the Co content of the target, whether age-hardening treatment was performed, purity (%), C concentration (ppm), O concentration (ppm), number of precipitates (10 μm or less), and the result and evaluation of measuring the number of particles (average value).

Example 4

Since the same processes as Example 1 (excluding the purity) were performed up to obtaining the ingot, the description thereof is omitted. The structure of the obtained Cu-10 at % Co ingot having a purity of 4N5, C: 7 ppm, and O: 5 ppm was adjusted by forging at a temperature of 900° C., cold rolling (rolling reduction of 70%), and heat treatment (500° C.) to prepare a target. The number of precipitates of 10 μm or less in the prepared target was 360 precipitates/mm$^2$. The prepared target was sputtered to deposit a film using a sputtering equipment, and the number of particles on the wafer was measured.

The number of particles was measured in the same manner as Example 1. The numbers of particles (average value) on the wafer were 6.3 particles/wafer with respect to particles of 0.2 μm or more, and 12.1 particles/wafer with respect to particles of 0.08 μm or more, and that resulted in extremely small numbers of particles.

Table 1 shows the Co content of the target, whether age-hardening treatment was performed, purity (%), C concentration (ppm), O concentration (ppm), number of precipitates (10 μm or less), and the result and evaluation of measuring the number of particles (average value).

Example 5

Since the same processes as Example 1 (excluding the purity) were performed up to obtaining the ingot, the description thereof is omitted. The structure of the obtained Cu-20 at % Co ingot having a purity of 5N, C: 9 ppm, and O: 9 ppm was adjusted by forging at a temperature of 900° C., cold rolling (rolling reduction of 70%), and heat treatment (500° C.) to prepare a target.

The number of precipitates of 10 μm or less in the prepared target was 450 precipitates/mm². The prepared target was sputtered to deposit a film using a sputtering equipment, and the number of particles on the wafer was measured.

The number of particles was measured in the same manner as Example 1. The numbers of particles (average value) on the wafer were 6.7 particles/wafer with respect to particles of 0.2 μm or more, and 12.5 particles/wafer with respect to particles of 0.08 μm or more, and that resulted in extremely small numbers of particles.

Table 1 shows the Co content of the target, whether age-hardening treatment was performed, purity (%), C concentration (ppm), O concentration (ppm), number of precipitates (10 μm or less), and the result and evaluation of measuring the number of particles (average value).

Comparative Example 1

Since the same processes as Example 1 (excluding the purity) were performed up to obtaining the ingot, the description thereof is omitted. A Cu-0.1 at % Co ingot having a purity of 4N, C: 4 ppm, and O: 6 ppm was prepared, and the prepared ingot was heated in the atmosphere at 1000° C.×1 hr, subject to age-hardening treatment, and subsequently water-cooled, and the structure of this ingot was thereafter adjusted by forging at a temperature of 900° C., cold rolling (rolling reduction of 70%), and heat treatment (500° C.) to prepare a target.

The number of precipitates of 10 μm or less in the prepared target was 800 precipitates/mm². The prepared target was sputtered to deposit a film using a sputtering equipment, and the number of particles on the wafer was measured.

The number of particles was measured in the same manner as Example 1. While the in-plane distribution of Co was constant, the numbers of particles (average value) on the wafer were 38.3 particles/wafer with respect to particles of 0.2 μm or more, and 102.8 particles/wafer with respect to particles of 0.08 μm or more, and that resulted extremely large numbers of particles. The cause is considered to be the precipitation of Cu—Co resulting from the age-hardening treatment.

Table 1 shows the Co content of the target, whether age-hardening treatment was performed, purity (%), C concentration (ppm), O concentration (ppm), number of precipitates (10 μm or less), and the result and evaluation of measuring the number of particles (average value).

Comparative Example 2

Since the same processes as Example 1 (excluding the purity) were performed up to obtaining the ingot, the description thereof is omitted. A Cu-1 at % Co ingot having a purity of 4N5, C: 3 ppm, and O: 8 ppm was prepared, and the prepared ingot was heated in the atmosphere at 1000° C.×1 hr, subject to age-hardening treatment, and subsequently water-cooled, and the structure of this ingot was thereafter adjusted by forging at a temperature of 900° C., cold rolling (rolling reduction of 70%), and heat treatment (500° C.) to prepare a target. The number of precipitates of 10 μm or less in the prepared target was 750 precipitates/mm².

The number of particles was measured in the same manner as Example 1. The prepared target was sputtered to deposit a film using a sputtering equipment, and the number of particles on the wafer was measured. Consequently, while the in-plane distribution of Co was constant, the numbers of particles (average value) on the wafer were 49.1 particles/wafer with respect to particles of 0.2 μm or more, and 111.5 particles/wafer with respect to particles of 0.08 μm or more, and that resulted in extremely large numbers of particles.

The cause is considered to be the considerable precipitation of Cu—Co resulting from the age-hardening treatment. Table 1 shows the Co content of the target, whether age-hardening treatment was performed, purity (%), C concentration (ppm), O concentration (ppm), number of precipitates (10 μm or less), and the result and evaluation of measuring the number of particles (average value).

Comparative Example 3

Since the same processes as Example 1 (excluding the purity) were performed up to obtaining the ingot, the description thereof is omitted. A Cu-5 at % Co ingot having a purity of 4N5, C: 2 ppm, and O: 7 ppm was prepared, and the prepared ingot was heated in the atmosphere at 1000° C.×1 hr, subject to age-hardening treatment, and subsequently water-cooled, and the structure of this ingot was thereafter adjusted by forging at a temperature of 900° C., cold rolling (rolling reduction of 70%), and heat treatment (500° C.) to prepare a target. The number of precipitates of 10 μm or less in the prepared target was 680 precipitates/mm².

The number of particles was measured in the same manner as Example 1. The prepared target was sputtered to deposit a film using a sputtering equipment, and the number of particles on the wafer was measured. Consequently, while the in-plane distribution of Co was constant, the numbers of particles (average value) on the wafer were 42.1 particles/wafer with respect to particles of 0.2 μm or more, and 98.3 particles/wafer with respect to particles of 0.08 μm or more, and that resulted in extremely large numbers of particles.

The cause is considered to be the considerable precipitation of Cu—Co resulting from the age-hardening treatment. Table 1 shows the Co content of the target, whether age-hardening treatment was performed, purity (%), C concentration (ppm), O concentration (ppm), number of precipitates (10 μm or less), and the result and evaluation of measuring the number of particles (average value).

Comparative Example 4

Since the same processes as Example 1 (excluding the purity) were performed up to obtaining the ingot, the description thereof is omitted. A Cu-10 at % Co ingot having a purity of 4N5, C: 6 ppm, and O: 9 ppm was prepared, and the prepared ingot was heated in the atmosphere at 1000° C.×1 hr, subject to age-hardening treatment, and subsequently water-cooled, and the structure of this ingot was thereafter adjusted by forging at a temperature of 900° C., cold rolling (rolling reduction of 70%), and heat treatment (500° C.) to prepare a target. The number of precipitates of 10 μm or less in the prepared target was 560 precipitates/mm².

The number of particles was measured in the same manner as Example 1. The prepared target was sputtered to deposit a film using a sputtering equipment, and the number of particles on the wafer was measured. Consequently, while the in-plane distribution of Co was constant, the numbers of particles (average value) on the wafer were 33.1 particles/wafer with respect to particles of 0.2 µm or more, and 65.2 particles/wafer with respect to particles of 0.08 µm or more, and that resulted in extremely large numbers of particles.

The cause is considered to be the considerable precipitation of Cu—Co resulting from the age-hardening treatment. Table 1 shows the Co content of the target, whether age-hardening treatment was performed, purity (%), C concentration (ppm), O concentration (ppm), number of precipitates (10 µm or less), and the result and evaluation of measuring the number of particles (average value).

Comparative Example 5

Since the same processes as Example 1 (excluding the purity) were performed up to obtaining the ingot, the description thereof is omitted. A Cu-20 at % Co ingot having a purity of 5N, C: 5 ppm, and O: 8 ppm was prepared, and the prepared ingot was heated in the atmosphere at 1000° C.×1 hr, subject to age-hardening treatment, and subsequently water-cooled, and the structure of this ingot was thereafter adjusted by forging at a temperature of 900° C., cold rolling (rolling reduction of 70%), and heat treatment (500° C.) to prepare a target. The number of precipitates of 10 µm or less in the prepared target was 900 precipitates/mm$^2$.

The number of particles was measured in the same manner as Example 1. The prepared target was sputtered to deposit a film using a sputtering equipment, and the number of particles on the wafer was measured. Consequently, while the in-plane distribution of Co was constant, the numbers of particles (average value) on the wafer were 56.3 particles/wafer with respect to particles of 0.2 µm or more, and 123.2 particles/wafer with respect to particles of 0.08 µm or more, and that resulted in extremely large numbers of particles.

The cause is considered to be the considerable precipitation of Cu—Co resulting from the age-hardening treatment. Table 1 shows the Co content of the target, whether age-hardening treatment was performed, purity (%), C concentration (ppm), O concentration (ppm), number of precipitates (10 µm or less), and the result and evaluation of measuring the number of particles (average value).

Comparative Example 6

Since the same processes as Example 1 (excluding the purity) were performed up to obtaining the ingot, the description thereof is omitted. A Cu-0.1 at % Co ingot having a purity of 3N5, C: 2 ppm, and O: 7 ppm was prepared, and the structure of this ingot was thereafter adjusted by forging at a temperature of 900° C., cold rolling (rolling reduction of 70%), and heat treatment (500° C.) to prepare a target. The number of precipitates of 10 µm or less in the prepared target was 890 precipitates/mm$^2$.

The number of particles was measured in the same manner as Example 1. The prepared target was sputtered to deposit a film using a sputtering equipment, and the number of particles on the wafer was measured. Consequently, while the in-plane distribution of Co was constant, the numbers of particles (average value) on the wafer were 32.1 particles/wafer with respect to particles of 0.2 µm or more, and 121.1 particles/wafer with respect to particles of 0.08 µm or more, and that resulted in extremely large numbers of particles.

The cause is considered to be the inferior purity, which consequently resulted in the considerable precipitation of Cu—Co.

Table 1 shows the Co content of the target, whether age-hardening treatment was performed, purity (%), C concentration (ppm), O concentration (ppm), number of precipitates (10 µm or less), and the result and evaluation of measuring the number of particles (average value).

Comparative Example 7

Since the same processes as Example 1 (excluding the purity) were performed up to obtaining the ingot, the description thereof is omitted. A Cu-1 at % Co ingot having a purity of 3N5, C: 6 ppm, and O: 3 ppm was prepared, and the structure of this ingot was thereafter adjusted by forging at a temperature of 900° C., cold rolling (rolling reduction of 70%), and heat treatment (500° C.) to prepare a target. The number of precipitates of 10 µm or less in the prepared target was 850 precipitates/mm$^2$.

The number of particles was measured in the same manner as Example 1. The prepared target was sputtered to deposit a film using a sputtering equipment, and the number of particles on the wafer was measured. Consequently, while the in-plane distribution of Co was constant, the numbers of particles (average value) on the wafer were 31.9 particles/wafer with respect to particles of 0.2 µm or more, and 111.9 particles/wafer with respect to particles of 0.08 µm or more, and that resulted in extremely large numbers of particles. The cause is considered to be the inferior purity, which consequently resulted in the considerable precipitation of Cu—Co.

Table 1 shows the Co content of the target, whether age-hardening treatment was performed, purity (%), C concentration (ppm), O concentration (ppm), number of precipitates (10 µm or less), and the result and evaluation of measuring the number of particles (average value).

Comparative Example 8

Since the same processes as Example 1 (excluding the purity) were performed up to obtaining the ingot, the description thereof is omitted. A Cu-5 at % Co ingot having a purity of 3N5, C: 3 ppm, and O: 4 ppm was prepared, and the structure of this ingot was thereafter adjusted by forging at a temperature of 900° C., cold rolling (rolling reduction of 70%), and heat treatment (500° C.) to prepare a target. The number of precipitates of 10 µm or less in the prepared target was 820 precipitates/mm$^2$.

The number of particles was measured in the same manner as Example 1. The prepared target was sputtered to deposit a film using a sputtering equipment, and the number of particles on the wafer was measured. Consequently, while the in-plane distribution of Co was constant, the numbers of particles (average value) on the wafer were 34.8 particles/wafer with respect to particles of 0.2 µm or more, and 100.2 particles/wafer with respect to particles of 0.08 µm or more, and that resulted in extremely large numbers of particles. The cause is considered to be the inferior purity, which consequently resulted in the considerable precipitation of Cu—Co.

Table 1 shows the Co content of the target, whether age-hardening treatment was performed, purity (%), C concentration (ppm), O concentration (ppm), number of precipitates (10 µm or less), and the result and evaluation of measuring the number of particles (average value).

Comparative Example 9

Since the same processes as Example 1 (excluding the purity) were performed up to obtaining the ingot, the description thereof is omitted. A Cu-10 at % Co ingot having a purity of 3N5, C: 8 ppm, and O: 5 ppm was prepared, and the structure of this ingot was thereafter adjusted by forging at a temperature of 900° C., cold rolling (rolling reduction of 70%), and heat treatment (500° C.) to prepare a target. The number of precipitates of 10 μm or less in the prepared target was 860 precipitates/mm$^2$.

The number of particles was measured in the same manner as Example 1. The prepared target was sputtered to deposit a film using a sputtering equipment, and the number of particles on the wafer was measured. Consequently, while the in-plane distribution of Co was constant, the numbers of particles (average value) on the wafer were 35.2 particles/wafer with respect to particles of 0.2 μm or more, and 140.2 particles/wafer with respect to particles of 0.08 μm or more, and that resulted in extremely large numbers of particles. The cause is considered to be the inferior purity, which consequently resulted in the considerable precipitation of Cu—Co.

Table 1 shows the Co content of the target, whether age-hardening treatment was performed, purity (%), C concentration (ppm), O concentration (ppm), number of precipitates (10 μm or less), and the result and evaluation of measuring the number of particles (average value).

Comparative Example 10

Since the same processes as Example 1 (excluding the purity) were performed up to obtaining the ingot, the description thereof is omitted. A Cu-20 at % Co ingot having a purity of 3N5, C: 4 ppm, and O: 5 ppm was prepared, and the structure of this ingot was thereafter adjusted by forging at a temperature of 900° C., cold rolling (rolling reduction of 70%), and heat treatment (500° C.) to prepare a target. The number of precipitates of 10 μm or less in the prepared target was 760 precipitates/mm$^2$.

The number of particles was measured in the same manner as Example 1. The prepared target was sputtered to deposit a film using a sputtering equipment, and the number of particles on the wafer was measured. Consequently, while the in-plane distribution of Co was constant, the numbers of particles (average value) on the wafer were 43.7 particles/wafer with respect to particles of 0.2 μm or more, and 79.2 particles/wafer with respect to particles of 0.08 μm or more, and that resulted in extremely large numbers of particles. The cause is considered to be the inferior purity, which consequently resulted in the considerable precipitation of Cu—Co.

Table 1 shows the Co content of the target, whether age-hardening treatment was performed, purity (%), C concentration (ppm), O concentration (ppm), number of precipitates (10 μm or less), and the result and evaluation of measuring the number of particles (average value).

Comparative Example 11

Since the same processes as Example 1 (excluding the purity) were performed up to obtaining the ingot, the description thereof is omitted. A Cu-0.1 at % Co ingot having a purity of 4N, C: 12 ppm, and O: 4 ppm was prepared, and the structure of this ingot was thereafter adjusted by forging at a temperature of 900° C., cold rolling (rolling reduction of 70%), and heat treatment (500° C.) to prepare a target. The number of precipitates of 10 μm or less in the prepared target was 800 precipitates/mm$^2$. The prepared target was sputtered to deposit a film using a sputtering equipment, and the number of particles on the wafer was measured.

The number of particles was measured in the same manner as Example 1. Consequently, while the in-plane distribution of Co was constant, the numbers of particles (average value) on the wafer were 39.2 particles/wafer with respect to particles of 0.2 μm or more, and 78.9 particles/wafer with respect to particles of 0.08 μm or more, and that resulted in extremely large numbers of particles.

The cause is considered to be the high C concentration as an impurity, which consequently resulted in the considerable precipitation of Cu—Co. Table 1 shows the Co content of the target, whether age-hardening treatment was performed, purity (%), C concentration (ppm), O concentration (ppm), number of precipitates (10 μm or less), and the result and evaluation of measuring the number of particles (average value).

Comparative Example 12

Since the same processes as Example 1 (excluding the purity) were performed up to obtaining the ingot, the description thereof is omitted. A Cu-0.1 at % Co ingot having a purity of 4N, C: 6 ppm, and O: 13 ppm was prepared, and the structure of this ingot was thereafter adjusted by forging at a temperature of 900° C., cold rolling (rolling reduction of 70%), and heat treatment (500° C.) to prepare a target. The number of precipitates of 10 μm or less in the prepared target was 830 precipitates/mm$^2$. The prepared target was sputtered to deposit a film using a sputtering equipment, and the number of particles on the wafer was measured.

The number of particles was measured in the same manner as Example 1. Consequently, while the in-plane distribution of Co was constant, the numbers of particles (average value) on the wafer were 33.8 particles/wafer with respect to particles of 0.2 μm or more, and 65.3 particles/wafer with respect to particles of 0.08 μm or more, and that resulted in extremely large numbers of particles. The cause is considered to be the high O concentration as an impurity, which consequently resulted in the considerable precipitation of Cu—Co. Table 1 shows the Co content of the target, whether age-hardening treatment was performed, purity (%), C concentration (ppm), O concentration (ppm), number of precipitates (10 μm or less), and the result and evaluation of measuring the number of particles (average value).

Comparative Example 13

Since the same processes as Example 1 (excluding the purity) were performed up to obtaining the ingot, the description thereof is omitted. A Cu-1 at % Co ingot having a purity of 4N, C: 20 ppm, and O: 5 ppm was prepared, and the structure of this ingot was thereafter adjusted by forging at a temperature of 900° C., cold rolling (rolling reduction of 70%), and heat treatment (500° C.) to prepare a target. The number of precipitates of 10 μm or less in the prepared target was 680 precipitates/mm$^2$. The prepared target was sputtered to deposit a film using a sputtering equipment, and the number of particles on the wafer was measured.

The number of particles was measured in the same manner as Example 1. Consequently, while the in-plane distribution of Co was constant, the numbers of particles (average value) on the wafer were 28.9 particles/wafer with respect to particles of 0.2 μm or more, and 49.7 particles/wafer with respect to particles of 0.08 μm or more, and that resulted in extremely large numbers of particles.

The cause is considered to be the high C concentration as an impurity, which consequently resulted in the considerable precipitation of Cu—Co. Table 1 shows the Co content of the target, whether age-hardening treatment was performed, purity (%), C concentration (ppm), O concentration (ppm), number of precipitates (10 μm or less), and the result and evaluation of measuring the number of particles (average value).

Comparative Example 14

Since the same processes as Example 1 (excluding the purity) were performed up to obtaining the ingot, the description thereof is omitted. A Cu-1 at % Co ingot having a purity of 4N, C: 7 ppm, and O: 30 ppm was prepared, and the structure of this ingot was thereafter adjusted by forging at a temperature of 900° C., cold rolling (rolling reduction of 70%), and heat treatment (500° C.) to prepare a target. The number of precipitates of 10 μm or less in the prepared target was 800 precipitates/mm$^2$. The prepared target was sputtered to deposit a film using a sputtering equipment, and the number of particles on the wafer was measured.

The number of particles was measured in the same manner as Example 1. Consequently, while the in-plane distribution of Co was constant, the numbers of particles (average value) on the wafer were 31.1 particles/wafer with respect to particles of 0.2 μm or more, and 57.7 particles/wafer with respect to particles of 0.08 μm or more, and that resulted in extremely large numbers of particles. The cause is considered to be the high O concentration as an impurity, which consequently resulted in the considerable precipitation of Cu—Co. Table 1 shows the Co content of the target, whether age-hardening treatment was performed, purity (%), C concentration (ppm), O concentration (ppm), number of precipitates (10 μm or less), and the result and evaluation of measuring the number of particles (average value).

Comparative Example 15

Since the same processes as Example 1 (excluding the purity) were performed up to obtaining the ingot, the description thereof is omitted. A Cu-5 at % Co ingot having a purity of 4N, C: 15 ppm, and O: 5 ppm was prepared, and the structure of this ingot was thereafter adjusted by forging at a temperature of 900° C., cold rolling (rolling reduction of 70%), and heat treatment (500° C.) to prepare a target. The number of precipitates of 10 μm or less in the prepared target was 560 precipitates/mm$^2$. The prepared target was sputtered to deposit a film using a sputtering equipment, and the number of particles on the wafer was measured.

The number of particles was measured in the same manner as Example 1. Consequently, while the in-plane distribution of Co was constant, the numbers of particles (average value) on the wafer were 35.2 particles/wafer with respect to particles of 0.2 μm or more, and 78.9 particles/wafer with respect to particles of 0.08 μm or more, and that resulted in extremely large numbers of particles.

The cause is considered to be the high C concentration as an impurity, which consequently resulted in the considerable precipitation of Cu—Co. Table 1 shows the Co content of the target, whether age-hardening treatment was performed, purity (%), C concentration (ppm), O concentration (ppm), number of precipitates (10 μm or less), and the result and evaluation of measuring the number of particles (average value).

Comparative Example 16

Since the same processes as Example 1 (excluding the purity) were performed up to obtaining the ingot, the description thereof is omitted. A Cu-5 at % Co ingot having a purity of 4N, C: 5 ppm, and O: 14 ppm was prepared, and the structure of this ingot was thereafter adjusted by forging at a temperature of 900° C., cold rolling (rolling reduction of 70%), and heat treatment (500° C.) to prepare a target. The number of precipitates of 10 μm or less in the prepared target was 620 precipitates/mm$^2$. The prepared target was sputtered to deposit a film using a sputtering equipment, and the number of particles on the wafer was measured.

The number of particles was measured in the same manner as Example 1.

Consequently, while the in-plane distribution of Co was constant, the numbers of particles (average value) on the wafer were 44.2 particles/wafer with respect to particles of 0.2 μm or more, and 77.9 particles/wafer with respect to particles of 0.08 μm or more, and that resulted in extremely large numbers of particles. The cause is considered to be the high O concentration as an impurity, which consequently resulted in the considerable precipitation of Cu—Co. Table 1 shows the Co content of the target, whether age-hardening treatment was performed, purity (%), C concentration (ppm), O concentration (ppm), number of precipitates (10 μm or less), and the result and evaluation of measuring the number of particles (average value).

Comparative Example 17

Since the same processes as Example 1 (excluding the purity) were performed up to obtaining the ingot, the description thereof is omitted. A Cu-10 at % Co ingot having a purity of 4N, C: 11 ppm, and O: 6 ppm was prepared, and the structure of this ingot was thereafter adjusted by forging at a temperature of 900° C., cold rolling (rolling reduction of 70%), and heat treatment (500° C.) to prepare a target. The number of precipitates of 10 μm or less in the prepared target was 590 precipitates/mm$^2$. The prepared target was sputtered to deposit a film using a sputtering equipment, and the number of particles on the wafer was measured.

The number of particles was measured in the same manner as Example 1. Consequently, while the in-plane distribution of Co was constant, the numbers of particles (average value) on the wafer were 32.5 particles/wafer with respect to particles of 0.2 μm or more, and 69.2 particles/wafer with respect to particles of 0.08 μm or more, and that resulted in extremely large numbers of particles.

The cause is considered to be the high C concentration as an impurity, which consequently resulted in the considerable precipitation of Cu—Co. Table 1 shows the Co content of the target, whether age-hardening treatment was performed, purity (%), C concentration (ppm), O concentration (ppm), number of precipitates (10 μm or less), and the result and evaluation of measuring the number of particles (average value).

Comparative Example 18

Since the same processes as Example 1 (excluding the purity) were performed up to obtaining the ingot, the description thereof is omitted. A Cu-10 at % Co ingot having a purity of 4N, C: 9 ppm, and O: 19 ppm was prepared, and the structure of this ingot was thereafter adjusted by forging at a temperature of 900° C., cold rolling (rolling reduction of 70%), and heat treatment (500° C.) to prepare a target. The number of precipitates of 10 μm or less in the prepared target was 540 precipitates/mm². The prepared target was sputtered to deposit a film using a sputtering equipment, and the number of particles on the wafer was measured.

The number of particles was measured in the same manner as Example 1. Consequently, while the in-plane distribution of Co was constant, the numbers of particles (average value) on the wafer were 29.7 particles/wafer with respect to particles of 0.2 μm or more, and 56.6 particles/wafer with respect to particles of 0.08 μm or more, and that resulted in extremely large numbers of particles. The cause is considered to be the high O concentration as an impurity, which consequently resulted in the considerable precipitation of Cu—Co. Table 1 shows the Co content of the target, whether age-hardening treatment was performed, purity (%), C concentration (ppm), O concentration (ppm), number of precipitates (10 μm or less), and the result and evaluation of measuring the number of particles (average value).

Comparative Example 19

Since the same processes as Example 1 (excluding the purity) were performed up to obtaining the ingot, the description thereof is omitted. A Cu-20 at % Co ingot having a purity of 4N, C: 14 ppm, and O: 9 ppm was prepared, and the structure of this ingot was thereafter adjusted by forging at a temperature of 900° C., cold rolling (rolling reduction of 70%), and heat treatment (500° C.) to prepare a target. The number of precipitates of 10 μm or less in the prepared target was 630 precipitates/mm². The prepared target was sputtered to deposit a film using a sputtering equipment, and the number of particles on the wafer was measured.

The number of particles was measured in the same manner as Example 1. Consequently, while the in-plane distribution of Co was constant, the numbers of particles (average value) on the wafer were 23.4 particles/wafer with respect to particles of 0.2 μm or more, and 59.8 particles/wafer with respect to particles of 0.08 μm or more, and that resulted in extremely large numbers of particles.

The cause is considered to be the high C concentration as an impurity, which consequently resulted in the considerable precipitation of Cu—Co. Table 1 shows the Co content of the target, whether age-hardening treatment was performed, purity (%), C concentration (ppm), O concentration (ppm), number of precipitates (10 μm or less), and the result and evaluation of measuring the number of particles (average value).

Comparative Example 20

Since the same processes as Example 1 (excluding the purity) were performed up to obtaining the ingot, the description thereof is omitted. A Cu-20 at % Co ingot having a purity of 4N, C: 5 ppm, and O: 20 ppm was prepared, and the structure of this ingot was thereafter adjusted by forging at a temperature of 900° C., cold rolling (rolling reduction of 70%), and heat treatment (500° C.) to prepare a target. The number of precipitates of 10 μm or less in the prepared target was 810 precipitates/mm². The prepared target was sputtered to deposit a film using a sputtering equipment, and the number of particles on the wafer was measured.

The number of particles was measured in the same manner as Example 1. Consequently, while the in-plane distribution of Co was constant, the numbers of particles (average value) on the wafer were 26.7 particles/wafer with respect to particles of 0.2 μm or more, and 69.4 particles/wafer with respect to particles of 0.08 μm or more, and that resulted in extremely large numbers of particles. The cause is considered to be the high O concentration as an impurity, which consequently resulted in the considerable precipitation of Cu—Co. Table 1 shows the Co content of the target, whether age-hardening treatment was performed, purity (%), C concentration (ppm), O concentration (ppm), number of precipitates (10 μm or less), and the result and evaluation of measuring the number of particles (average value).

The high purity copper-cobalt alloy sputtering target of the present invention is a high purity copper-cobalt alloy sputtering target containing 0.1 to 20 at % of Co, and remainder being Cu and unavoidable impurities, wherein carbon (C) and oxygen (O) as impurities contained in the target are each 10 ppm or less, and purity is 99.99% (4N) or higher. It is thereby possible to inhibit the generation of particles during sputtering.

Consequently, it is possible to improve the yield and reliability of semiconductor products that are being subject to further miniaturization and higher integration. Furthermore, the present invention is effective in forming a copper alloy wiring for semiconductors with superior electromigration (EM) resistance and corrosion resistance, which are characteristics unique to a high purity copper-cobalt alloy.

The invention claimed is:

1. A high purity copper-cobalt alloy sputtering target having a composition containing 0.1 to 20 at % of Co, and remainder being Cu and unavoidable impurities, wherein precipitates contained in a structure of the sputtering target have a size of 10 μm or less and a number of the precipitates is 500 precipitates/mm² or less.

2. The high purity copper-cobalt alloy sputtering target according to claim 1, wherein carbon (C) and oxygen (O) as impurities contained in the target are each 10 ppm or less, and purity of the target is 99.99% (4N) or higher.

3. The high purity copper-cobalt alloy sputtering target according to claim 1, wherein the target is produced by subjecting a target raw material to melting, casting, forging, heat treatment, and machining.

4. The high purity copper-cobalt alloy sputtering target according to claim 1, wherein carbon as an impurity contained in the target is 2 to 9 wtppm and oxygen as an impurity contained in the target is 5 to 9 wtppm.

5. The high purity copper-cobalt alloy sputtering target according to claim 1, wherein the number of precipitates of the size of 10 μm or less is 130 to 450 precipitates/mm².

6. The high purity copper-cobalt alloy sputtering target according to claim 1, wherein the composition of the sputtering target further contains one or more additive elements selected from the group consisting of Sb, Zr, Ti, Cr, Ag, Au, Cd, In, As, Be, B, Mg, Mn, Al, Si, Ca, Ba, La, and Ce in a total amount of 500 ppm or less.

7. A method of producing a high purity copper-cobalt alloy sputtering target having a composition containing 0.1 to 20 at % of Co, and remainder being Cu and unavoidable impurities, comprising the steps of subjecting raw materials of cobalt and copper to melting and casting to prepare an ingot, and subjecting the ingot to hot forging, cold rolling and heat treatment, without going through age-hardening treatment, and processing into a target structure, wherein precipitates contained in a structure of the sputtering target have a size of 10 μm or less and a number of the precipitates is 500 precipitates/mm² or less, and wherein the raw materials have a purity of 99.99% (4N) or higher, and carbon and oxygen as impurities contained in the raw materials are each 10 ppm or less.

8. The method according to claim 7, wherein the target structure has carbon as impurity in an amount of 2 to 9 wtppm and oxygen as an impurity in an amount of 5 to 9 wtppm.

9. The method according to claim 7, wherein the number of precipitates of the size of 10 μm or less is 130 to 450 precipitates/mm$^2$.

10. The method according to claim 7, wherein the composition of the sputtering target further contains one or more additive elements selected from the group consisting of Sb, Zr, Ti, Cr, Ag, Au, Cd, In, As, Be, B, Mg, Mn, Al, Si, Ca, Ba, La, and Ce in a total amount of 500 ppm or less.

11. A high purity copper-cobalt alloy sputtering target consisting of Cu, 0.1 to 20 at % of Co, impurities, and precipitates, wherein said precipitates are of a size limited to 10 μm or less and are of a number limited to 500 precipitates/mm$^2$ or less, wherein the sputtering target has a purity of 99.99% (4N) or higher, and wherein said impurities total 0.01% (100 ppm) or less and include a content of carbon of 10 ppm or less and a content of oxygen of 10 ppm or less.

12. The high purity copper-cobalt alloy sputtering target according to claim 11, wherein said content of carbon is 2 to 9 wtppm, said content of oxygen is 5 to 9 wtppm, and said number of precipitates is 130 to 450 precipitates/mm$^2$.

\* \* \* \* \*